US009412789B1

(12) United States Patent
Herner

(10) Patent No.: US 9,412,789 B1
(45) Date of Patent: Aug. 9, 2016

(54) STACKABLE NON-VOLATILE RESISTIVE SWITCHING MEMORY DEVICE AND METHOD OF FABRICATING THE SAME

(71) Applicant: Crossbar, Inc., Santa Clara, CA (US)

(72) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/715,159

(22) Filed: May 18, 2015

Related U.S. Application Data

(60) Continuation of application No. 14/175,062, filed on Feb. 7, 2014, now Pat. No. 9,035,276, which is a continuation of application No. 13/679,976, filed on Nov. 16, 2012, now Pat. No. 8,648,327, which is a division of application No. 12/861,650, filed on Aug. 23, 2010, now Pat. No. 8,492,195.

(51) Int. Cl.
*H01L 47/00* (2006.01)
*H01L 27/24* (2006.01)
*H01L 45/00* (2006.01)

(52) U.S. Cl.
CPC ........ *H01L 27/2463* (2013.01); *H01L 27/2436* (2013.01); *H01L 45/1233* (2013.01); *H01L 45/1253* (2013.01); *H01L 45/16* (2013.01)

(58) Field of Classification Search
CPC ......... H01L 47/00; H01L 27/01; H01L 27/24; H01L 27/101; H01L 45/04
USPC .......................................................... 257/5
See application file for complete search history.

(56) References Cited

U.S. PATENT DOCUMENTS

| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |

(Continued)

FOREIGN PATENT DOCUMENTS

| EP | 2405441 | 1/2012 |
| EP | 2408035 | 1/2012 |

(Continued)

OTHER PUBLICATIONS

Jian Hu et al., "Area-Dependent Switching in Thin Film-Silicon Devices", Materials Research Society Proceedings, 2003, pp. A18.3.1-A18.3.6, vol. 762, No. 1, Cambridge University Press.

(Continued)

*Primary Examiner* — Phuc Dang
(74) *Attorney, Agent, or Firm* — Amin, Turocy & Watson, LLP

(57) ABSTRACT

A memory device includes a first plurality of memory cells arranged in a first crossbar array, a first thickness of dielectric material overlying the first plurality of memory cells, and a second plurality of memory cells arranged in a second crossbar array overlying the first thickness of dielectric material. The memory device further includes a second thickness of dielectric material overlying the second plurality of memory cells. In a specific embodiment, the memory device further includes a Nth thickness of dielectric material overlying an Nth plurality of memory cells, where N is an integer ranging from 3 to 8.

25 Claims, 13 Drawing Sheets

(56) References Cited

U.S. PATENT DOCUMENTS

| | | |
|---|---|---|
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,707,487 A | 1/1998 | Hori et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,973,335 A | 10/1999 | Shannon |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur et al. |
| 6,180,998 B1 | 1/2001 | Crafts |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,740,921 B2 | 5/2004 | Matsuoka et al. |
| 6,762,474 B1 | 7/2004 | Mills, Jr. |
| 6,806,526 B2 | 10/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,848,012 B2 | 1/2005 | Leblanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,858,468 B2 | 12/2010 | Liu et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Nazarian et al. |
| 8,315,079 B2 | 11/2012 | Kuo et al. |
| 8,320,160 B2 | 11/2012 | Nazarian et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,404,553 B2 | 3/2013 | Herner |
| 8,441,835 B2 | 5/2013 | Jo et al. |
| 8,450,209 B2 | 5/2013 | Herner |
| 8,450,710 B2 | 5/2013 | Clark |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2005/0221565 A1* | 10/2005 | Tamura ............ H01L 27/11507 438/295 |

(56) References Cited

U.S. PATENT DOCUMENTS

| | | |
|---|---|---|
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0281244 A1 | 12/2006 | Ichige et al. |
| 2007/0008773 A1 | 1/2007 | Scheuerlein et al. |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar et al. |
| 2009/0174519 A1* | 7/2009 | Mikawa ............... H01L 27/101 338/20 |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0155687 A1* | 6/2010 | Reyes et al. .................. 257/4 |
| 2010/0155651 A1 | 6/2010 | Kumar et al. |
| 2010/0157710 A1 | 6/2010 | Lambertson et al. |
| 2010/0163828 A1 | 7/2010 | Tu |
| 2010/0176365 A1* | 7/2010 | Park ............... H01L 45/124 257/3 |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0245029 A1* | 9/2010 | Schricker et al. ............... 338/13 |
| 2010/0258782 A1* | 10/2010 | Kuse ............ H01L 45/146 257/4 |
| 2010/0321095 A1 | 12/2010 | Mikawa et al. |
| 2010/0323489 A1 | 12/2010 | Park et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0141832 A1* | 6/2011 | Balakrishnan ........... G11C 5/02 365/189.16 |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |
| 2013/0026440 A1 | 1/2013 | Yang et al. |
| 2013/0214241 A1 | 8/2013 | Herner et al. |
| 2014/0070160 A1 | 3/2014 | Ishikawa et al. |
| 2014/0192589 A1* | 7/2014 | Maxwell et al. ............... 365/148 |

FOREIGN PATENT DOCUMENTS

| | | |
|---|---|---|
| JP | 2005506703 | 3/2005 |
| JP | 2006032951 | 2/2006 |
| JP | 2007067408 | 3/2007 |
| JP | 2007281208 | 10/2007 |
| JP | 2007328857 | 10/2007 |
| JP | 2008147343 | 6/2008 |
| KR | 1020110014248 | 2/2011 |
| WO | 03034498 | 4/2003 |
| WO | 2009005699 | 1/2009 |

(56) References Cited

FOREIGN PATENT DOCUMENTS

| WO | 2010026654 | 3/2010 |
|---|---|---|
| WO | 2010042732 | 4/2010 |
| WO | 2011133138 | 10/2011 |

OTHER PUBLICATIONS

Andre Dehon, "Array-Based Architecture for FET-Based, Nanoscale Electronics", IEEE Transactions on Nanotechnology, Mar. 2003, pp. 23-32, vol. 2, No. 1.
Herb Goronkin et al., "High Performance Emergin Solid-State Memory Technologies", MRS Bulletin, Nov. 2004, pp. 805-813, www.mrs.org/publications/bulletin.
Gerhard Muller, et al., "Status and Outlook of Emerging Nonvolatile Memory Technologies", IEEE, 2004, pp. 567-570.
A.E. Owen, et al., "Memory Switching in Amorphous Silicon Devices", Journal of Non-Crystalline Solids 59 & 60, 1983, pp. 1273-1280, North-Holland Publishing Company.
J. Campbell Scott, "Is There An Immortal Memory?", www.sciencemag.org, Apr. 2, 2004, pp. 62-63, vol. 304, No. 5667.
S. H. Lee, et al., "Full Integration and Cell Characteristics For 64Mb Novolatile PRAM", 2004 Symposium on VLSI Technology Dgest of Technical Papers, pp. 20-21, 2004 IEEE.
Stephen Y. Chou, et al., "Imprint Lithography With 25-Nanometer Resolution", Science, Apr. 5, 1996, pp. 85-87, vol. 272.
S. Zankovych et al., "Nanoimprint Lithography: Challenges and Prospects", Institute of Physics Publishing, Nanotechnology 12, 2001, pp. 91-95.
A. Avila et al., "Switching in Coplanar Amorphous Hydrogenated Silicon Devices", Solid-State Electronics 44, 2000, pp. 17-27.
Jian Hu et al., "Switching and Filament Formation in Hot-Wire CVD P-Type A-Si:H Devices", Science Direct, Thin Solid Films 430, 2003, pp. 249-252, www.sciencedirect.com.
S. Hudgens, et al., "Overview of Phase-Change Chalcogenide Nonvolatile Memory Technology", MRS Bulletin, Nov. 2004, pp. 829-832, www.mrs.org/publications/bulletin.
K. Terabe et al, "Quantized Conductance Atomic Switch", Nature, vol. 433, Jan. 6, 2005, pp. 47-50, www.nature.com/nature.
Michael Kund, et al., "Conductive Bridging RAM (CBRAM): An Emerging Non-Volatile Memory Technology Scalable to Sub 20m,", IEEE, 2005.
W. Den Boer, "Threshold Switching in Hydrogenated Amorphous Silicon", American Institute of Physics, 1982, pp. 812-813.
P.G. Lecomber et al., "The Switching Mechanism in Amorphous Silicon Junctions", Journal of Non-Crystalline Solids 77 & 78, 1985, pp. 1373-1382, North-Holland, Amsterdam.
A.E. Owen, et al., "Switching in Amorphous Devices", Int. J. Electronics, 1992, pp. 897-906, vol. No. 5.
M. Jafar et al., "Switching in Amorphous-Silicon Devices", The American Physical Society, 1994, pp. 611-615, vol. 49, No. 19.
Stikeman, "Polymer Memory—The Plastic Path to Beller Data Storage", Technology Review, Sep. 2002, p. 31, www.technologyreview.com.
Chen et al., "Nanoscale molecular-switch crossbar circuits," Nontechnology 14, 2003, pp. 462-468, vol. 1.14, Institute of Physics Publishing.
Collier et al., "Electronically Configurable Molecular-Based Logic Gates", Jul. 16, 1999, pp. 391-395, vol. 285, No. 5426.
Office Action for U.S. Appl. No. 11/875,541, dated Jul. 22, 2010.
Office Action for U.S. Appl. No. 11/875,541, dated Mar. 30, 2011.
Office Action for U.S. Appl. No. 11/875,541, dated Oct. 5, 2011.
Office Action for U.S. Appl. No. 11/875,541, dated Jun. 6, 2012.
Choi, "Molecular Electronic Crossbar Memory Circuits", Bistable (2)Rotaxane Based Molecular Electronics: Fundamentals and Applications, Chapter 3, pp. 79-124, Dissertation <http://resolver.caltech.edu/CaltechETD:etd-05242007-194737>2007, pp. 79-120, California Institute of Technology, Pasadena.
Jo et al, "A Silicon-Based Crossbar Ultra-High-Density Non-Volatile Memory", SSEL Annual Report 2007.

International Search Report and Written Opinion for PCT/US2009/060023, filed on Oct. 8, 2009.
Waser, et al., "Nanoionics-based Resistive Switching Memories", Nature Materils, Nov. 2007, pp. 833-835, vol. 6.
Written Opinion of the International Searching Authority for PCT/US2009/060023, filed Oct. 8, 2009.
Ex Parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090, filed on Jun. 10, 2011.
Notice of Allowance for U.S. Appl. No. 13/158,231, dated Apr. 17, 2012.
Office Action for U.S. Appl. No. 12/861,650 dated Jan. 25, 2012.
Notice of Allowability for U.S. Appl. No. 12/861,650 dated Jun. 19, 2012.
Jo et al., "Programmable Resistance Switching in Nanoscale Two-Terminal Devices, "Supporting Information, Dec. 29, 2008, pp. 1-4, vol. 9, No. 1, Department of Electrical Engineering and Computer Science, the University of Michigan, Ann Arbor, Michigan.
Kim et al., "Nanoscale resistive memory with intrinsic diode characteristics and long endurance," Applied Physics Letters, 2010, pp. 053106-1-053106-3, vol. 96, American Institute of Physics.
Jo et al., Si-Based Two-Terminal Resistive Switching Nonvolatile Memory, 2008, IEEE.
Jo et al., "Nanoscale Memristor Device as Synapse in Neuromorphic Systems", Nano Letters, 2010, pp. 1297-1301, Pubs.acs.org/NanoLett, A-E, American Chemical Society Publications.
Wei Lu et al, "Nanoelectronics from the bottom up", Nature Materials—Review Articles, Insight, www.nature.com/naturematerials, Nov. 2007, pp. 841-850, vol. 6, Nature Publishing Group.
Jo et al., "Ag/a-Si:H/c-Si Resistive Switching Nonvolatile Memory Devices", Nanotechnology Materials and Devices Conference, IEEE, 2006, pp. 116-117, vol. 1.
Jo et al., "Experimental, Modeling and Simulation Studies of Nanoscale Resistance Switching Devices," 9th Conference on Nanotechnology, 2009, IEEE.
Jo et al., "Nonvolatile Resistive Switching Devices Based on Nanoscale Metal/Amorphous Silicon/Crystalline Silicon Junctions," Mater. Res. Soc Symp Proc., 2007, vol. 997, Materials Research Society.
Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Jo et al., "High-Density Crossbar Arrays Based on a Si Memrisitve System", Nano Letters, 2009, pp. 870-874, vol. 9, No. 2, American Chemical Society Publications.
Jo et al., "High-Density Crossbar Arrays Based on a Si Memrisitve System", Supporting Information, 2009, pp. 1-4.
Jo et al., "Programmable Resistance Switching in Nanoscale Two-Terminal Devices," Nano Letters 2009, pp. 496-500, vol. 9, No. 1, American Chemical Society Publications.
Gangopadhyay, et al., "Memory Switching in Sputtered Hydrogenated Amorphous Silicon (a-Si:H)", Japanese Journal of Applied Physics, Short Notes, 1985, pp. 1363-1364, vol. 24, No. 10, JPN. J. APPL. PHYS.
Dey, "Electrothermal model of switching in amorphous silicon films", J. Vac. Sci. Technol., Jan./Feb. 1980, pp. 145-448, vol. 17, No. 1, American Vacuum Society.
Hajto, et a., "The Programmability of Amorphous Silicon Analogue Memory Elements", Mat. Res. Soc. Symp. Proc. 1990, pp. 405-410, vol. 192, Materials Research Society.
Rose, et al, "Amorphous Silicon Analogue Memory Devices", Journal of Non-Crystalline Solids 115, 1989, pp. 168-170, Elsevier Science Publishers B.V., North-Holland.
Moopenn, et al., "Programmable Synaptic Devices for Electronic Neural Nets", Control and Computers, 1990, pp. 37-40, vol. 18, No. 2.
Comber, "Present and Future Applications of Amorphous Silicon and Its Alloys", Journal of No-Crystalline Solids 115, 1989, pp. 1-13, Elsevier Science Publishers B.V., North-Holland.

(56) References Cited

OTHER PUBLICATIONS

Hu et al., "AC Characteristics of Cr/p/sup +/A-Si:HIV Analog Switching Devices." IEEE Transactions on Electron Devices, Sep. 2000, pp. 1751-1757, vol. 47, No. 9.
Owen, et al. "New Amorphous-silicon electrically programmable nonvolatile switching device," Solid-State and Electron Devices, IEEE Proceedings I, Apr. 1982, pp. 51-54, vol. 129, No. 2.
Hajto et al., "Amorphous & Microcrystalline Semiconductor Devices: vol. 2, Materials and Device Physics", Mar. 1, 2004, pp. 640-700, Artech House Publishers.
Hajto et al., "Analogue memory and ballistic electron effects in metal-amorphous silicon structures," Philosophical Magazine B, 1991, pp. 349-369, vol. 63, No. 1, Taylor & Francis Ltd.
Holmes et al., Design of Analogue Synapse Circuits using Non-Volatile a-Si:H Memory Devices, Proceedings of ISCAS, 1994, pp. 351-354.
Dong et al., "Si/a-Si Core/Shell Nanowires as Nonvolatile Crossbar Switches", Nano Letters, Jan. 2008, pp. 386-391, vol. 8, No. 2, American Chemical Society.
European Search Report for Application No. EP09819890.6 of Mar. 27, 2012.
Muller et al., "The Electronic Structure at the Atomic Scale of Ultrathin Gate Oxides", Nature, Jun. 1998, pp. 758-761, vol. 399, No. 24.
Sune, et al., "Nondestructive Multiple Breakdown Events in Very Thin Si02 Films", Applied Physics Letters, 1989, vol. 55 No. 128.
Marand, "Materials Engineering Science", MESc 5025 Chapter 7, University of Vermont, http://www.files.chem.vt.edu/chemdeptimarand/MEScchap6-1 c.pdf.
Owen et al., "Electronic switching in amorphouse silicon devices: properties of the conductig filament", proceedings of the 5th International Conference o Solid-State and Integrated Cicuit Technology, 1998, pp. 830-833.
Jo, "Nanoscale Memristive Devices for Memory and Logic Applications", Thesis, University of Michigan, 2010.
Office Action for U.S. Appl. No. 12/894,098, dated Aug. 1, 2012.
Jo et al., "CMOS Compatible Nanoscale Nonvolatile Resistance Switching Memory," Nano Letters, 2008, pp. 392-397, vol. 8, No. 2, American Chemical Society Publications.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249, filed on Oct. 20, 2009.
Written Opinion of the International Searching Authority for PCT/US2009/061249, filed Oct. 20, 2009.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP11005207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Chang et al., "Aluminum spiking at contact windows in Al/Ti-W/Si", Appl. Phys. Lett., Jan. 25, 1988, pp. 272-274, vol. 52, No. 4, American Institute of Physics.
Alamo et al., "Operating limits of Al-alloyed high-low junction for BSF Solar cells", Solid-State Electronics, 1981, pp. 115-420, vol. 24, Pergamon Press Ltd., Great Britain.
Yuan et al., "Silicon Solar Cells wth Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Notice of Allowance for U.S. Appl. No. 12/894,087, dated Oct. 25, 2012.
Notice of Allowance for U.S. Appl. No. 13/149,807, dated Oct. 29, 2012.
Notice of Allowance for U.S. Appl. No. 12/861,666, dated Nov. 14, 2012.
Office Action for U.S. Appl. No. 13/156,232 dated Nov. 26, 2012.
Notice of Allowance for U.S. Appl. No. 13/290,024 dated Nov. 28, 2012.
Office Action for Application No. EP11005207.3 mailed Aug. 8, 2012.
Office Action for U.S. Appl. No. 13/417,135 dated Oct. 9, 2012.
Office Action for U.S. Appl. No. 13/149,653 dated Nov. 20, 2012.
Notice of Allowance for U.S. Appl. No. 13/748,490 dated Apr. 9, 2013.
Office Action for U.S. Appl. No. 14/072,657 dated Jun. 17, 2014.
Office Action for U.S. Appl. No. 13/705,082 dated Sep. 2, 2014.
Office Action for U.S. Appl. No. 13/739,283 dated Sep. 11, 2014.
Office Action for U.S. Appl. No. 13/756,498 dated Sep. 12, 2014.
Notice of Allowance for U.S. Appl. No. 13/462,653 dated Sep. 17, 2014.
Notice of Allowance for U.S. Appl. No. 13/586,815 dated Sep. 18, 2014.
Notice of Allowance for U.S. Appl. No. 13/920,021 dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,491 dated Oct. 8, 2014.
Office Action for U.S. Appl. No. 13/077,941 dated Aug. 27, 2013.
Notice of Allowance for U.S. Appl. No. 13/761,132 dated Sep. 4, 2014.
Notice of Allowance for U.S. Appl. No. 13/620,012 dated Sep. 9, 2014.
Notice of Allowance for U.S. Appl. No. 13/870,919 dated Sep. 9, 2014.
Office Action for U.S. Appl. No. 13/143,047 dated Apr. 11, 2014.
Notice of Allowance for U.S. Appl. No. 13/761,132 dated Apr. 25, 2014.
Notice of Allowance for U.S. Appl. No. 13/077,941 dated Oct. 8, 2014, 4 pages.
Japanese Office Action and English Translation dated Mar. 24, 2015 for Japanese Patent Application No. 2011-153349, 9 pages.
Chinese Office Action with English Translation for Chinese Patent Application No. 201110195933.7 dated May 18, 2015, 10 pages.
Office Action for U.S. Appl. No. 12/835,704 dated Mar. 14, 2014, 14 pages.
Office Action for U.S. Appl. No. 13/564,639 dated Mar. 19, 2013, 21 pages.
Office Action for U.S Appl. No. 14/573,817, dated Jul. 9, 2015, 9 pages.
Suehle et al. "Temperature Dependence of Soft Breakdown and Wearout in Sub-3 nm SiO2 Films", IEEE Annual International Reliability Physics Symposium, 2000, pp. 33-34, San Jose, California.
Shin et al. "Effect of Native Oxide on Polycrystalline Silicon CMP", Journal of the Korean Physical Society, Mar. 2009, pp. 1077-1081, vol. 54, No. 3.

(56) References Cited

OTHER PUBLICATIONS

Office Action for U.S. Appl. No. 13/447,036 dated Jul. 9, 2013.
Office Action for U.S. Appl. No. 13/764,698 dated Jul. 11, 2013.
Office Action for U.S. Appl. No. 13/481,600 dated Sep. 20, 2013.
Office Action for U.S Appl. No. 13/564,639, dated Dec. 6, 2013, 24 pages.
Notice of Allowance for U.S. Appl. No. 13/461,725 dated Nov. 13, 2013, 10 pages.
Office Action for U.S. Appl. No. 12/913,719 dated Feb. 17, 2011, 11 pages.
Office Action for U.S. Appl. No. 12/913,719 dated Jul. 22, 2011, 12 pages.
Notice of Allowance for U.S. Appl. No. 12/913,719 dated Mar. 12, 2012, 5 pages.
Office Action for U.S. Appl. No. 13/705,082 dated Sep. 2, 2014, 9 pages.
Office Action for U.S Appl. No. 14/325,289 dated Dec. 5, 2014, 5 pages.
Office Action for U.S Appl. No. 14/325,289 dated Aug. 28, 2015, 10 pages.
Office Action for U.S. Appl. No. 13/436,714 dated Dec. 7, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S Appl. No. 13/314,513 dated Jan. 24, 2013.
Notice of Allowance for U.S Appl. No. 13/118,258 dated Feb. 6, 2013.
International Search Report and Written Opinion for PCT/US2012/040242, filed May 31, 2012.
Notice of Allowance for U.S. Appl. No. 13/725,331 dated Jan. 17, 2014.
Office Action for U.S. Appl. No. 13/739,283 dated Jan. 16, 2014.
Office Action for U.S. Appl. No. 12/861,432 dated Jan. 8, 2014.
Office Action for U.S. Appl. No. 13/586,815 dated Jan. 29, 2014.
Office Action for U.S. Appl. No. 13/433,567 dated Feb. 6, 2014.
Office Action for U.S. Appl. No. 13/620,012 dated Feb. 11, 2014.
Notice of Allowance for U.S. Appl. No. 13/468,201 dated Feb. 20, 2014.
Office Action for U.S. Appl. No. 12/625,817 dated Feb. 28, 2014.
Office Action for U.S. Appl. No. 12/835,704 dated Mar. 14, 2014.
Office Action for U.S. Appl. No. 13/870,919 dated Apr. 3, 2014.
Office Action for U.S. Appl. No. 13/167,920 dated Mar. 12, 2014.
International Search Report and Written Opinion for PCT/US2013/077628, filed on Dec. 23, 2013.
Notice of Allowance for U.S. Appl. No. 13/417,135 dated Oct. 23, 2013.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035, filed on Jul. 29, 2011.
International Search Report and Written Opinion for PCT/US2013/061244 filed on Sep. 23, 2013.
Office Action for U.S. Appl. No. 13/174,264 dated Mar. 6, 2013.
Office Action for U.S. Appl. No. 13/679,976 dated Mar. 6, 2013.
Notice of Allowance for U.S. Appl. No. 12/894,098 dated Mar. 15, 2013.
Office Action for U.S. Appl. No. 13/465,188 dated Mar. 19, 2013.
Office Action for U.S. Appl. No. 12/861,432 dated Mar. 29, 2013.
Office Action for U.S. Appl. No. 13/725,331 dated May 20, 2013.
International Search Report and Written Opinion for PCT/US2012/045312, filed on Jul. 2, 2012.
Office Action for U.S. Appl. No. 13/466,008 dated Jul. 29, 2013.
Ugo, et al., "Self Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli et al., "Evidence for Threshold Switching in the set process of NiO-based RRAM and Physical modeling for set, reset, retention and disturb prediction", IEEE International Electron Devices Meeting, Dec. 15-17, 2008, pp. 1-4, San Francisco, CA USA.
Office Action for U.S. Appl. No. 13/077,941 dated Aug. 12, 2013.
Office Action for U.S. Appl. No. 13/436,714 dated Aug. 27, 2013.
Notice of Allowance for U.S. Appl. No. 13/679,976 dated Sep. 17, 2013.
Office Action for U.S. Appl. No. 13/189,401, dated Sep. 30, 2013.
Office Action for U.S. Appl. No. 13/462,653 dated Sep. 30, 2013.
Corrected Notice of Allowance for U.S. Appl. No. 13/733,828 dated Oct. 1, 2013.
Notice of Allowance for U.S. Appl. No. 13/733,828 dated Aug. 8, 2013.
Office Action for U.S. Appl. No. 13/594,664 dated Aug. 2, 2013.
Notice of Allowance for U.S. Appl. No. 13/769,152 dated Oct. 8, 2013.
Notice of Allowance for U.S. Appl. No. 13/905,074 dated Oct. 8, 2013.
Notice of Allowance for U.S. Appl. No. 13/452,657 dated Oct. 10, 2013.
Notice of Allowance for U.S. Appl. No. 13/174,264 dated Oct. 16, 2013.
Notice of Allowance for U.S. Appl. No. 13/532,019 dated Nov. 14, 2012.
Office Action for U.S. Appl. No. 12/861,650, dated Oct. 16, 2012.
Office Action for U.S. Appl. No. 13/920,021 dated Jan. 10, 2014.

\* cited by examiner

STACKABLE NON-VOLATILE RESISTIVE SWITCHING MEMORY DEVICE AND METHOD OF FABRICATING THE SAME

CROSS REFERENCE TO RELATED APPLICATIONS

The present application is a continuation of and claims priority to U.S. patent application Ser. No. 14/175,062, filed Feb. 7, 2014, which is a continuation of U.S. patent application Ser. No. 13/679,976, filed Nov. 16, 2012, (now U.S. Pat. No. 8,648,327), which is a division of U.S. patent application Ser. No. 12/861,650, filed Aug. 23, 2010, (now U.S. Pat. No. 8,492,195). The contents of each of the foregoing applications are hereby incorporated herein by reference in their entirety.

BACKGROUND

The present disclosure is generally related to resistive switching devices. More particularly, embodiments according to the present disclosure provide a method and a structure for forming a stacked or vertically stacked resistive switching device. The present disclosure can be applied to non-volatile memory devices but it should be recognized that the present disclosure can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching for a PCRAM device requires large amounts of power. Organic RAM or ORAM is incompatible with large volume silicon-based fabrication and device reliability is usually poor.

From the above, a new semiconductor device structure and integration is desirable.

BRIEF SUMMARY

The present disclosure is generally related to resistive switching devices. More particularly, embodiments according to the present disclosure provide a method and a structure for forming a stacked or vertically stacked resistive switching device. The present disclosure can be applied to non-volatile memory devices but it should be recognized that the present disclosure can have a much broader range of applicability.

In a specific embodiment, a method of forming a vertically-stacked memory device is provided. The method includes providing a semiconductor substrate having a surface region. A first dielectric material is formed overlying the surface region of the semiconductor substrate. The method includes forming a first plurality of memory cells overlying the first dielectric material. In a specific embodiment, each of the first plurality of memory cells including at least a first top metal wiring structure spatially extending in a first direction, a first bottom wiring structure spatially extending in a second direction orthogonal to the first top metal wiring structure, a first switching element sandwiched between an intersection region of the first electrode structure and the second electrode structure. In a specific embodiment, the method includes forming a thickness of second dielectric material overlying the first plurality of memory cells including the top wiring structures. In a specific embodiment, the method forms a second plurality of memory cells overlying the second dielectric material, each of the second plurality of memory cells comprising at least a second top metal wiring structure extending in the first direction, and a second bottom wiring structure arranged spatially orthogonal to the second top metal wiring structure, and a second switching element sandwiched between the second top wiring structure and the second bottom wiring structure. More pluralities of memory cells may be formed above these two layers. As used herein, the term "vertical or vertically" is not in reference to gravity but in reference to a major plane of a substrate structure or the like.

In a specific embodiment, a memory device is provided. The memory device includes a first plurality of memory cells arranged in a first crossbar array. A first thickness of dielectric material overlies the first plurality of memory cells, and a second plurality of memory cells arranged in a second crossbar array overly the first thickness of dielectric material. In certain embodiment, the memory device can include three to eight layers of cell array. Each of the cell array is separated from a next using a thickness of dielectric material in a specific embodiment.

Many benefits can be achieved by ways of the present disclosure. For example, the present method forms a vertically stacked memory device to provide for a high density device structure using existing CMOS processing equipment and techniques. In certain embodiments, the present method provides arrays of interconnected memory cells with diode steering elements to decrease die size and enhance memory cell performance. Depending on the embodiment, one or more of these benefits may be achieved. One skilled in the art would recognize other variations, modifications, and alternatives.

DETAILED DESCRIPTION

The present disclosure is generally related to resistive switching devices. More particularly, embodiments according to the present disclosure provide a method and a structure for forming a vertically stacked resistive switching device. The present disclosure can be applied to non-volatile memory devices but it should be recognized that the present disclosure can have a much broader range of applicability.

The memory function of current non volatile memory devices are based on charges trapped in a dielectric material or a silicon floating gate. However, scaling of such chargetrap based materials is limited. For example, floating gate devices such as NOR or NAND devices have feature sizes of approximately $10F^2$ and $4.5F^2$, respectively, where F is the smallest feature size. Embodiments according to the present disclosure provide a method to form a non-volatile resistive switching device in layers which can be vertically stacked on top of one another to increase device density and to achieve an effective cell size of less than $4F^2$. Additionally, fabrication of the memory device is fully compatible with current CMOS processes.

Figure 1:
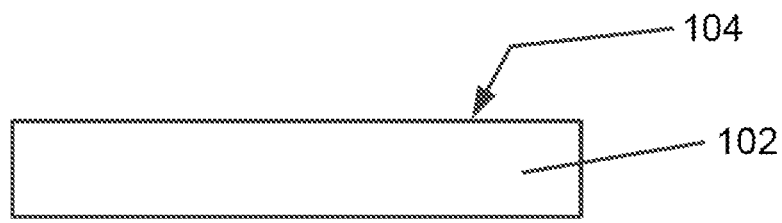
FIGS. 1-16 are simplified diagram illustrating a method of forming a resistive switching device according to an embodiment of the present disclosure.
Figure 2:
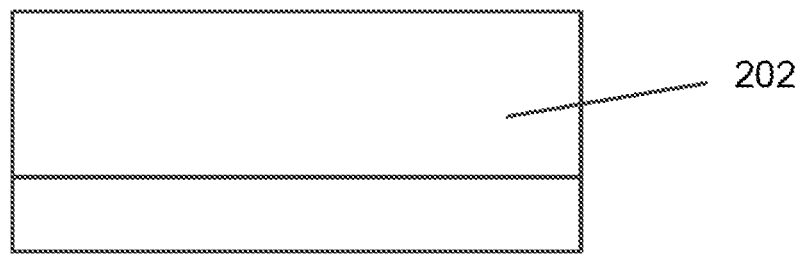

FIGS. 1-16 illustrate a method of fabricating a resistive switching device according to an embodiment of the present disclosure. The method includes providing a substrate 102 including a surface region 104. The substrate can be a semiconductor substrate such as a silicon wafer and the like. In certain embodiments, the substrate can include one or more devices formed thereon. The one or more devices can include transistor devices or others, depending on the embodiment. As shown in FIG. 2, the method includes forming a first dielectric material 202 overlying the surface region of the substrate. The first dielectric material can be a silicon oxide or a silicon nitride or a suitable dielectric film stack including a combination of different dielectric films. The first dielectric material can be formed using techniques such as chemical vapor deposition, spin on coating, including a combination of these techniques, and others.

Figure 3:
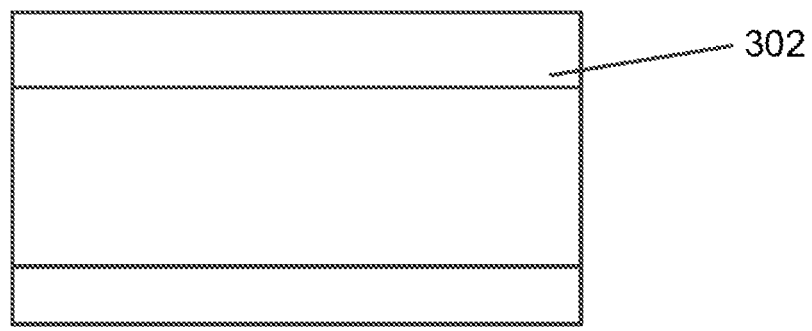
Figure 4:
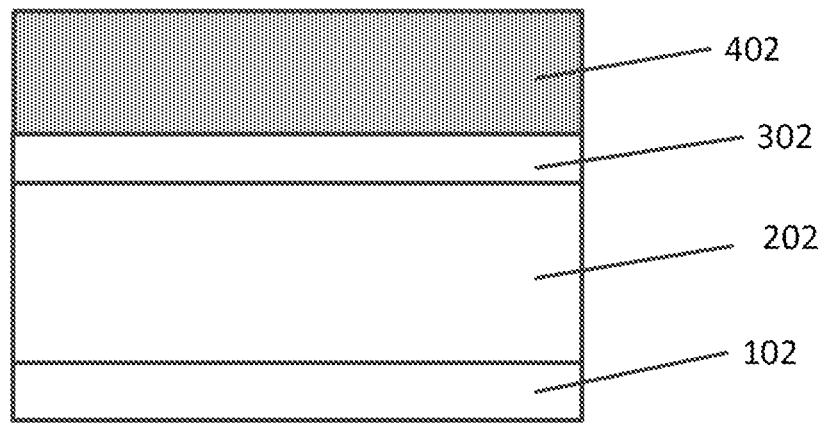

Referring to FIG. 3, the method deposits a first adhesion layer 302 overlying the first dielectric material. The first adhesion layer can be titanium, titanium nitride, tantalum, tantalum nitride, or tungsten nitride, or any combinations of these material, and others. The first adhesion layer may be formed using physical vapor deposition, chemical vapor deposition, or atomic layer deposition, and the like. In other applications, physical deposition such as sputtering may be used depending on the application. As shown in FIG. 4, a bottom wiring material 402 is formed overlying the first adhesion layer. The bottom wiring structure material can be aluminum, tungsten, copper, or other suitable metal materials depending on the embodiment. The bottom wiring material can be deposited using techniques such as physical vapor deposition, evaporation, chemical vapor deposition, electrochemical methods such as electroplating or electrode-less deposition from a liquid medium, or other suitable deposition techniques including a combination. The first adhesion layer provides a glue layer for the first wiring material and the first dielectric material in a specific embodiment.

Figure 5:
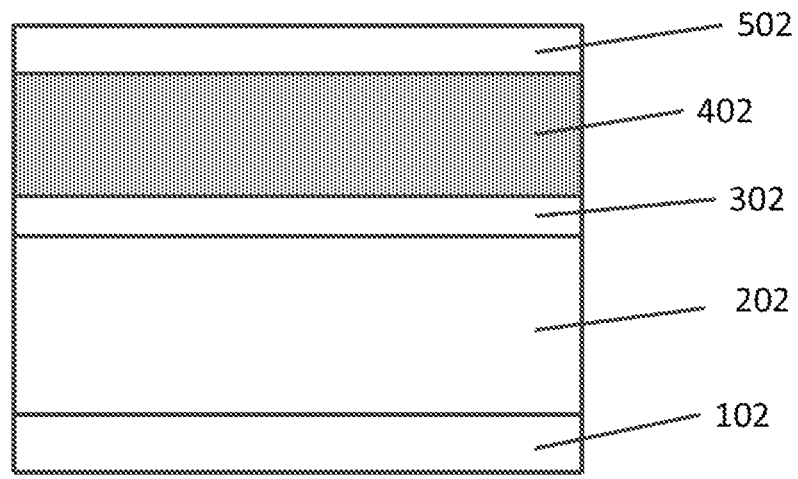

As shown in FIG. 5, the method of forming the switching device includes depositing a second adhesion layer 502 overlying the bottom wiring structure material. The second adhesion layer can also be a barrier layer or a blocking layer to prevent chemical reaction of the bottom wiring structure material with, for example, a switching layer material subsequently formed. The second adhesion layer can be titanium, titanium nitride, tantalum, tantalum nitride, tungsten, tungsten nitride, or others, depending on the embodiment.

Figure 6:
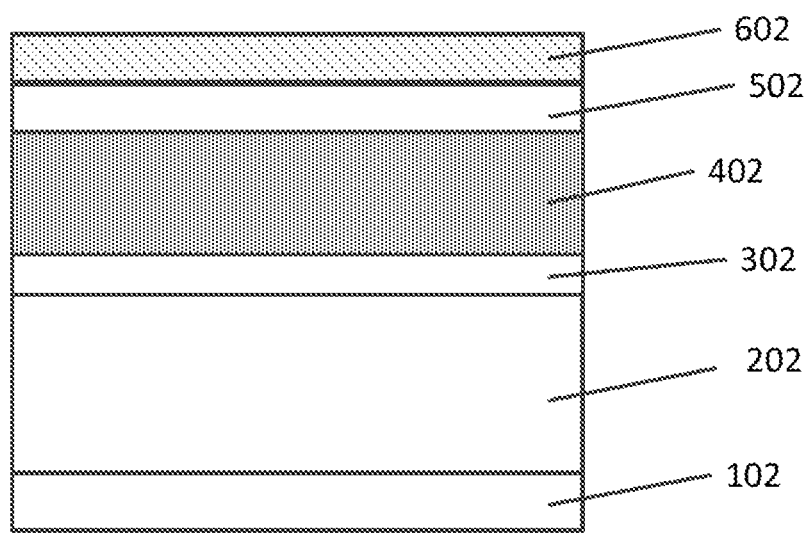

Referring to FIG. 6, the method includes forming a doped semiconductor material 602 overlying the second adhesion layer in a specific embodiment. The doped semiconductor material can be doped polycrystalline silicon, hereafter referred to as polysilicon material in a specific embodiment. The polysilicon material is used as a contact material between the bottom wiring material and an amorphous silicon switching material in a specific embodiment. In a preferred embodiment, the doped polysilicon material is $p^+$ doped, using impurity such as boron and the like. In a specific embodiment, the boron has a concentration ranging from about 1E18 to 1E21 $cm^{-3}$. The p+ polycrystalline silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor, and any suitable gas containing a p+ dopant for silicon, such as diborane, $B_2H_6$. In a specific embodiment, the p+ polycrystalline silicon material may be deposited using a plasma-assisted chemical deposition method. Deposition temperature for the p+ silicon material can range from about 200 Degree Celsius to about 500 Degree Celsius and preferably at about 400 Degree Celsius to about 450 Degree Celsius. In certain embodiments, the polysilicon material may be further processed to enhance the performance of the switching device. For example, defects or nano metal material may be formed in a surface region of the doped polysilicon material to enhance the performance of the switching device. In a specific embodiment, the polysilicon material allows for controlling and improving switching properties of the amorphous silicon switching material. For other switching materials, such as metal oxide, or others, other contact material may be used, or the contact layer may not be needed. Of course, one skilled in the art would recognize other variations, modifications, and alternatives.

Figure 7:
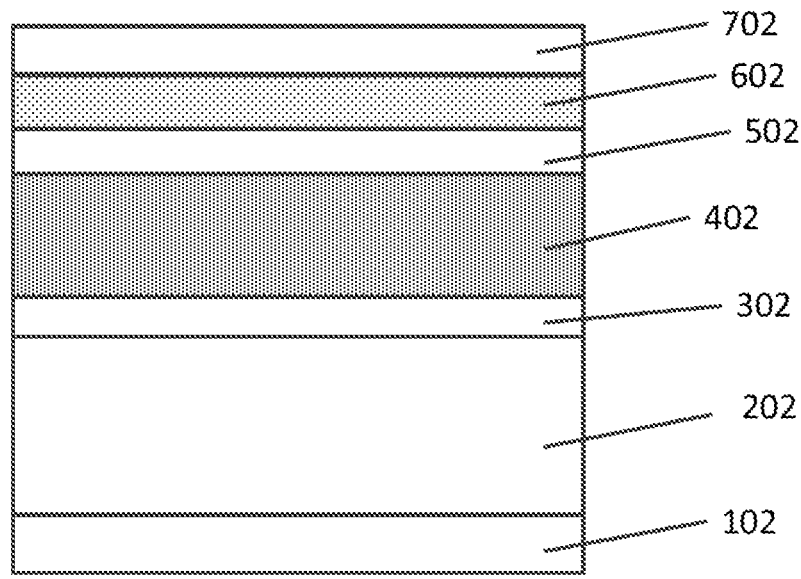

In a specific embodiment, the method forms a switching material 702 overlying the contact material as shown in FIG. 7. The switching material can be an undoped amorphous silicon material having an intrinsic semiconductor characteristic. The undoped amorphous silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor. In a specific embodiment, the undoped amorphous silicon material may be deposited using a plasma-assisted chemical deposition method. Deposition temperature for the amorphous silicon material can range from about 1500 Degree Celsius to about 450 Degree Celsius and preferably at about 350 Degree Celsius to about 400 Degree Celsius. Depending on the embodiment, the amorphous silicon material can be provided at a thickness ranging from about 50 Angstroms to about 1000 Angstroms. In a preferred embodiment, the amorphous silicon material is provided at a thickness ranging from about 200 Angstroms to about 700 Angstroms.

Figure 8:
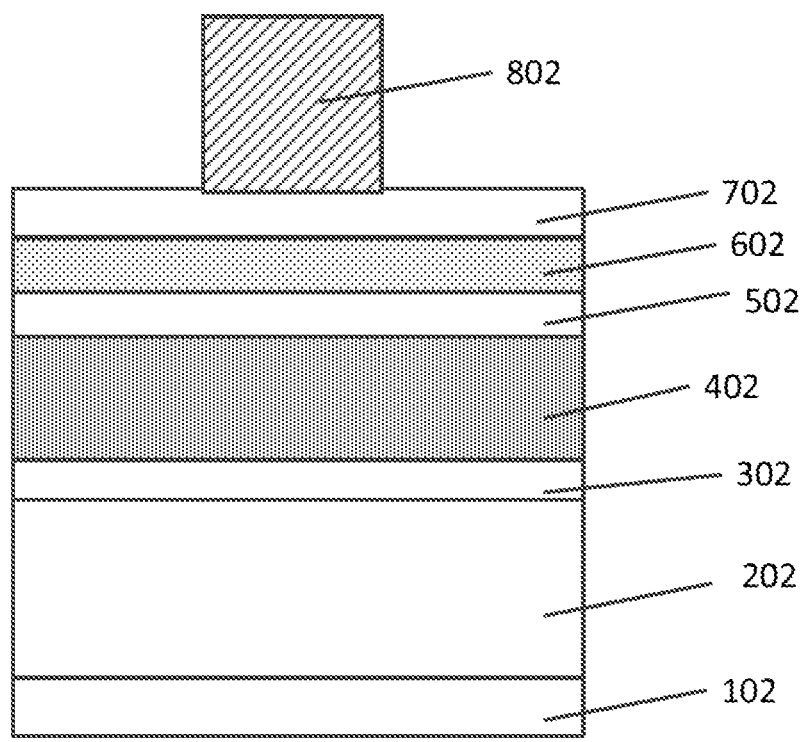

Referring to FIG. 8, the method includes forming a mask 802 overlying the switching material. The masking layer can be a suitable organic photoresist material, or an inorganic hard mask, or a combination of the two, depending on the embodiment. The hard mask can be formed from a dielectric material such as silicon oxide or silicon nitride, or others depending on the application. The hard mask may also be a metal or dielectric hard mask depending on the embodiment.

Figure 9:
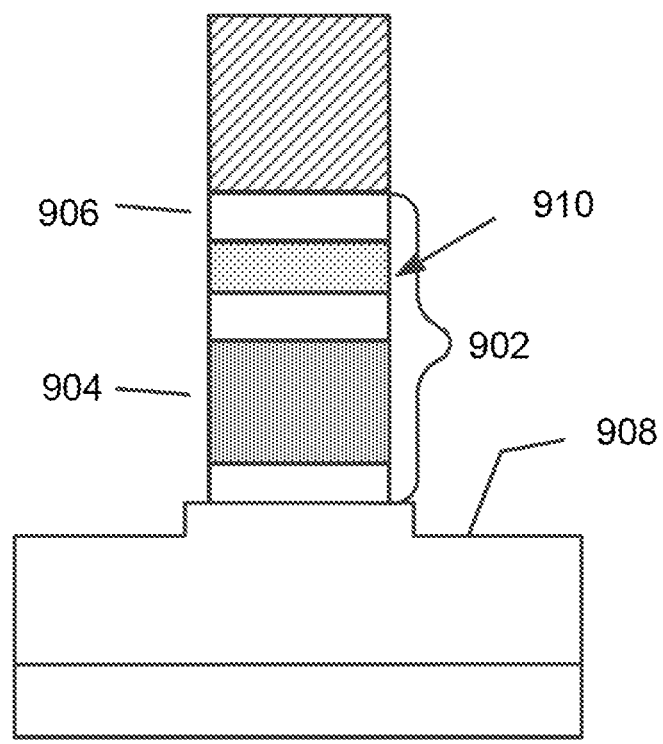

In a specific embodiment, the method subjects the switching material, the contact material, and the bottom wiring structure material to a first etching process using the masking layer as a mask to form a first structure 902 as shown in FIG. 9. The first etching process selectively removes a portion of the first dielectric material exposing a top surface region 908 of the first dielectric material. The first structure includes at least a bottom wiring structure 904, and a switching element 906 in a specific embodiment. The switching element includes at least a first side region 910. Depending on the hard mask used, any remaining portion of the hard mask after etching may be removed. Alternatively, the remaining hard mask after etch may be left intact if it is a dielectric.

Figure 10:
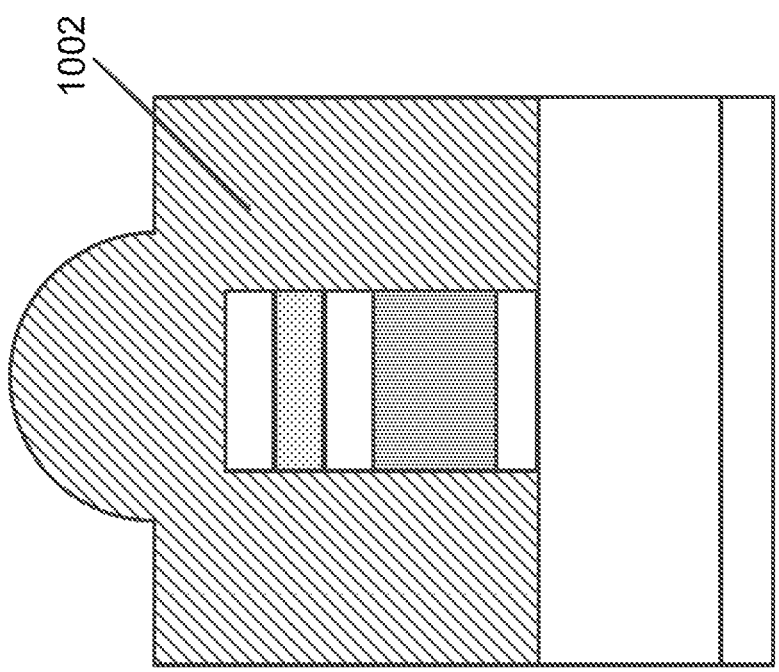

Referring to FIG. 10, the method includes depositing a second dielectric layer 1002 overlying the first structure and exposed portion of the first dielectric layer. The second dielectric layer can include a silicon oxide material or silicon nitride material or a combination depending on the embodiment, or any suitable dielectric material depending on the application. In a specific embodiment, the second dielectric layer can be silicon oxide deposited using a high density plasma enhanced chemical vapor deposition process, commonly known as HDP, using silane and oxygen as precursors. The silicon dioxide may also be deposited by a plasma enhanced deposition process (PECVD) using tetramethlyoxsilicate, commonly known as TEOS. The silicon oxide material may also be formed using a spin on coating technique followed by a suitable curing process. Or a combination of coating and chemical deposition may also be used depending on the application.

Figure 11:
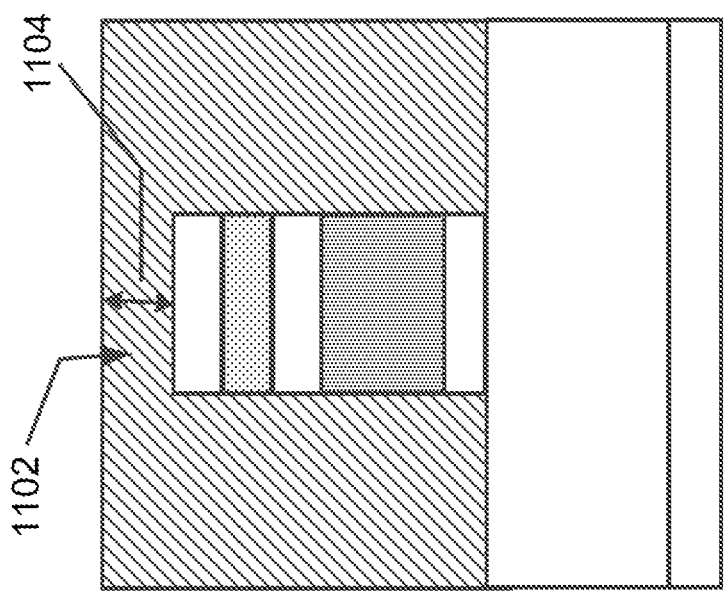
Figure 12:
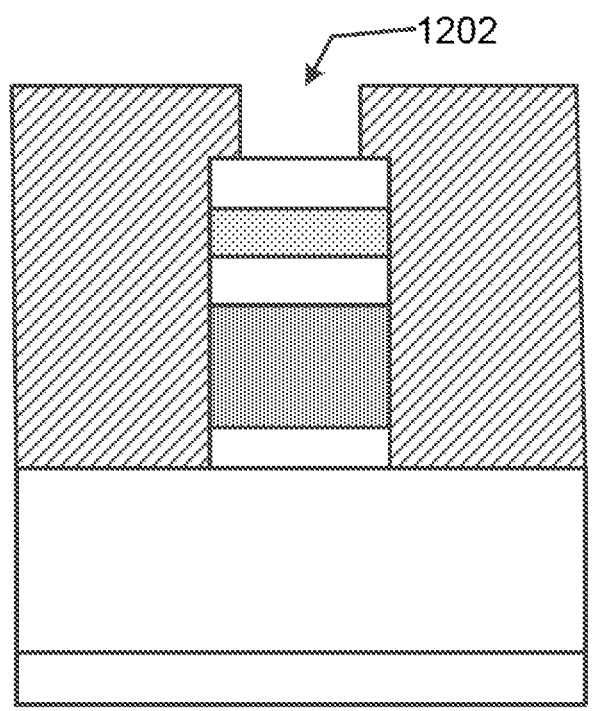

In a specific embodiment, the method employs a planarizing process to form a planarized dielectric surface 1102 as illustrated in FIG. 11. This may be accomplished by a chemical mechanical polishing process, or a non isotropic chemical etch, for example, a blanket etch of the second dielectric material in a specific embodiment. As shown, a portion 1104 of the second dielectric material is maintained overlying a top region of the switching element in a specific embodiment. In a specific embodiment, the method includes forming a first opening region 1202 in a portion of the second dielectric material to expose a portion of the top region of the switching element as shown in FIG. 12. The first opening region is formed by using a second patterning and etching process in a specific embodiment. The first opening region has a first dimension in a specific embodiment. For example for silicon dioxide as the dielectric material, the etching process may be a dry etch, such as a fluorine-based etching using $CF_4$, $SF_6$, or $NF_3$, as the etching gas. A suitable wet etching technique, such as a HF-based etching may also be used depending on the embodiment. Alternatively, laser ablation may be used to selectively remove the silicon oxide material overlying the switching material to form the first opening region.

Figure 13:
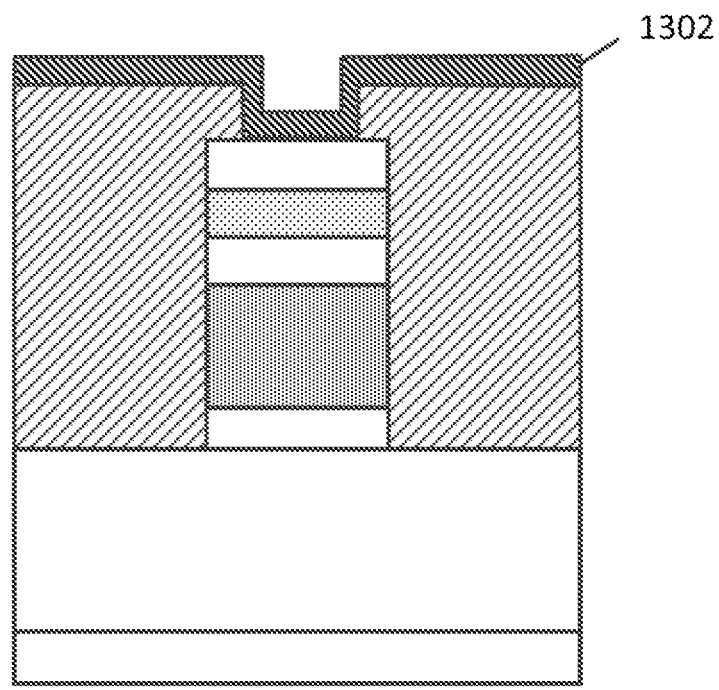

In a specific embodiment, the method includes forming a third dielectric material 1302 overlying the second dielectric layer including the first opening region as shown in FIG. 13. As shown, the third dielectric material is conformably formed overlying the second dielectric layer and the first opening region in a specific embodiment. The third dielectric material can be silicon nitride in a specific embodiment. Other suitable dielectric materials such as silicon oxide or a dielectric stack (for example, a silicon oxide on silicon nitride on silicon oxide stack, commonly known as ONO) may also be used depending on the embodiment.

Figure 14:
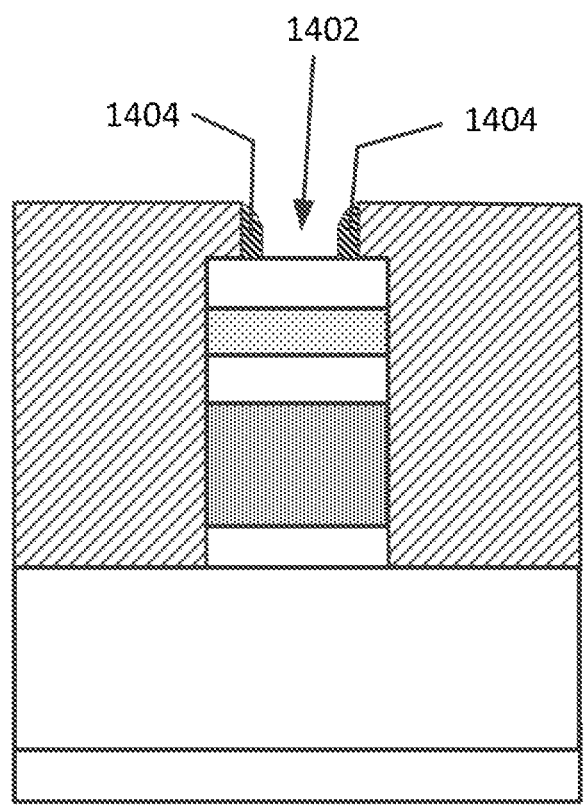

Referring to FIG. 14, the method subjects the third dielectric material to a nonconformal or an anisotropic etching process to remove a portion of the third dielectric material to form a second opening region 1402. As shown, the anisotropic etching process forms a side wall structure 1404 overlying the side region of the first opening region and a bottom region. The bottom region includes an exposed portion of the switching material in a specific embodiment. This etch is commonly used in semiconductor processing, and is known as a "sidewall spacer" etch. The exposed portion has a second dimension, which is less than the first dimension.

Figure 15:
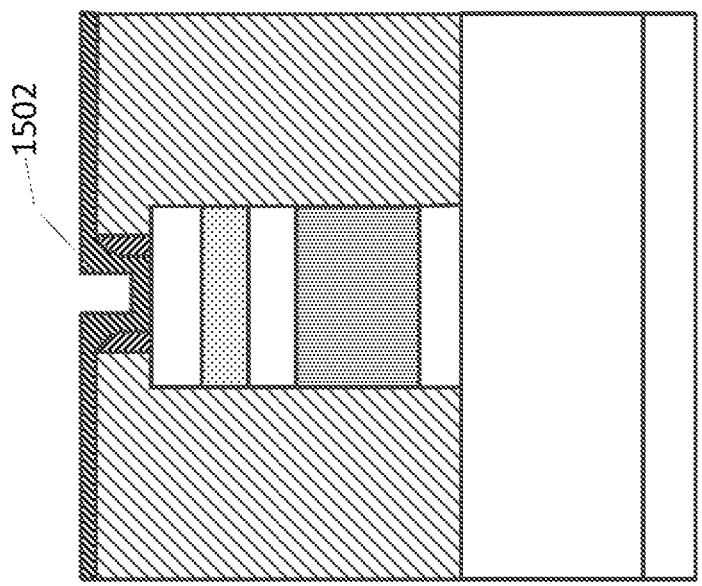

Referring to FIG. 15, the method forms a conductive material 1502 overlying at least the bottom region and the side wall structure. The conductive material substantially fills the second opening region and in contact with the switching material in a specific embodiment. Alternatively, the conductive material can be conformally formed overlying the second opening region including the bottom region and the side wall structure depending on the deposition conditions. The conductive material is in contact with the switching element, as shown. In a specific embodiment, for an amorphous silicon switching material, the conductive material can be a silver material. The silver material can be deposited using a physical deposition process such as sputtering or evaporation. The silver material may also be formed using a chemical deposition process such as chemical vapor deposition, electrochemical such as electroplating or electroless plating, or a combination depending on the application.

Figure 16:
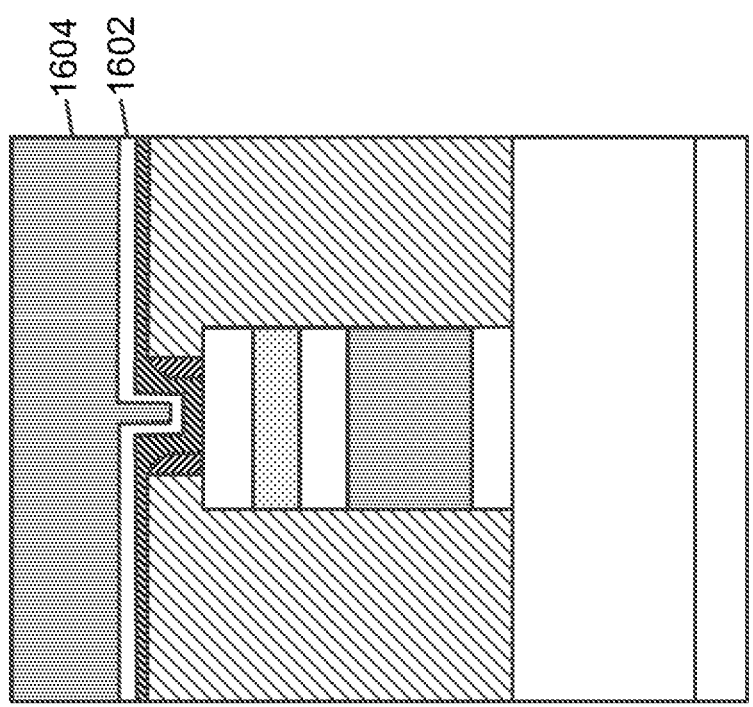

In a specific embodiment, the method includes forming a top barrier material 1602 overlying at least the conductive material and a top wiring material 1604 overlying the top barrier material as illustrated in FIG. 16 in a specific embodiment. The top barrier material can be a top adhesion material in a specific embodiment. The top barrier material can be titanium, titanium nitride, tantalum or tantalum nitride, tungsten, or tungsten nitride, or any suitable barrier material depending on the embodiment. Depending on the application, top barrier layer 1602 can be formed using a chemical deposition such as atomic layer deposition, chemical vapor deposition, and others, or a physical deposition such as sputtering, depending on the application. Top barrier material 1602 can protect the conductive material, for example, the silver material from oxidation in a specific embodiment. Top barrier material can also be a diffusion barrier between the conductive material and the top wiring material in a specific embodiment.

Again, depending on the embodiment, the top wiring material can be aluminum, tungsten, copper, or others. The top wiring structure material may be deposited using techniques such as physical vapor deposition process, for example, sputtering, evaporation, and others. The top wiring material may also be deposited using chemical deposition such as chemical vapor deposition, electrochemically including electroplating and electrodeless deposition depending on the embodiment.

In a specific embodiment, the method subjects a stack of material comprising the top wiring material, the top barrier material, and the contact material to a third pattern and etch process to from a top wiring structure. In a specific embodiment, the conductive material is in contact with the switching element. The top wiring structure is configured spatially at an angle to the bottom wiring structure to form a cross bar structure in a specific embodiment. In a specific embodiment, the top wiring structure is configured spatially orthogonal to the bottom wiring structure. The switching element is disposed in an intersection region of the top electrode structure and the bottom electrode structure. As merely an example, for a switching device using an amorphous silicon material as the switching material, the stack of material can comprise of aluminum, titanium nitride, and silver, while silver is in contact with the amorphous silicon material. Of course one skilled in the art would recognize other variations, modifications, and alternatives.

The above sequence of steps provides a method of forming a first array of memory cells for a vertically stacked device according to an embodiment of the present disclosure. The method forms a fourth dielectric material 1702 overlying the top wiring structure of first array of memory cells. The fourth dielectric material 1702 further fills in any gaps between the top interconnect wires. As shown, two memory cells are illustrated in the first array of memory cells. The first array of memory cells can have an X by Y array arranged in a crossbar configuration, where X and Y are integers and X>1, and Y>1. In a specific embodiment, fourth dielectric material 1702 can be silicon oxide, silicon nitride, or a dielectric stack with alternating dielectric materials, depending on the application. As shown, fourth dielectric material 1702 forms a thickness 1704 overlying the first array of memory cells. In a specific embodiment, the fourth dielectric material is subjected to a planarizing process to form a planarized surface region.

Figure 18:
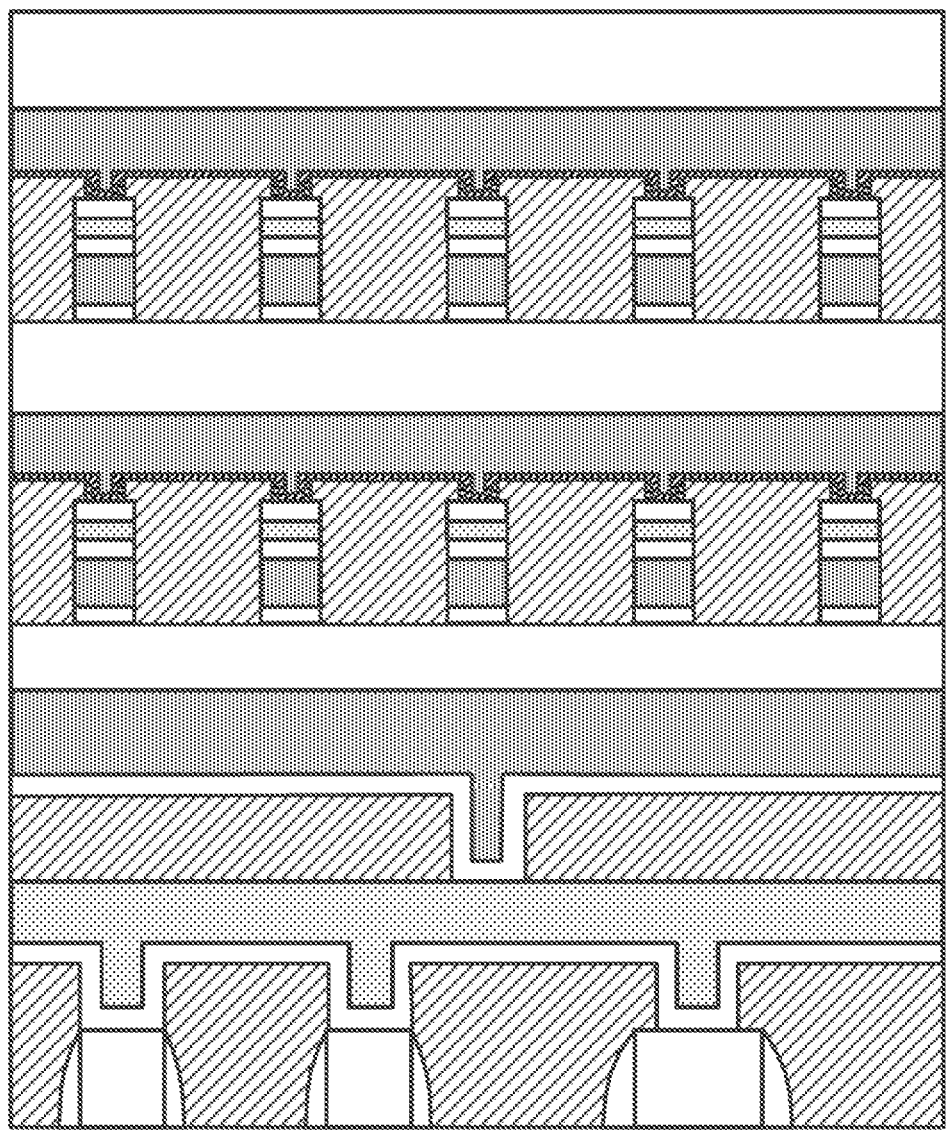

The method forms a second array of memory cells overlying the planarized fourth dielectric material as shown in FIG. 18. The second array of memory cells includes a plurality of memory cells. Each of the plurality of memory cells includes at least a second top electrode, a second bottom electrode, and a switching element sandwiched between the second top electrode and the second bottom electrode in a specific embodiment. The second top electrode extends in a direction parallel to the first top electrode in a specific embodiment. In a specific embodiment, the second bottom electrode and the second top electrode are spatially arranged at an angle, and preferably orthogonal to each other in a crossbar configuration. The method than repeats the above steps of forming a memory array and dielectric material stack to form a vertically stacked memory device. For example, a four layers of memory cell array result in an effective memory cell size of $1F^2$, where F is the feature size of a memory cell. In certain embodiment, each of the memory cells in an array can have an incipient diode to prevent program and read disturbs when selecting a device in an interconnecting array. In contrast to conventional configuration, the CMOS circuitry for programming the memory devices is beneath the layers of memory cell arrays. Therefore, the CMOS devices do not occupy additional area on the substrate. Vertical stacking as illustrated in FIG. 8 allows for a high density device and a small die size.

Figure 17:
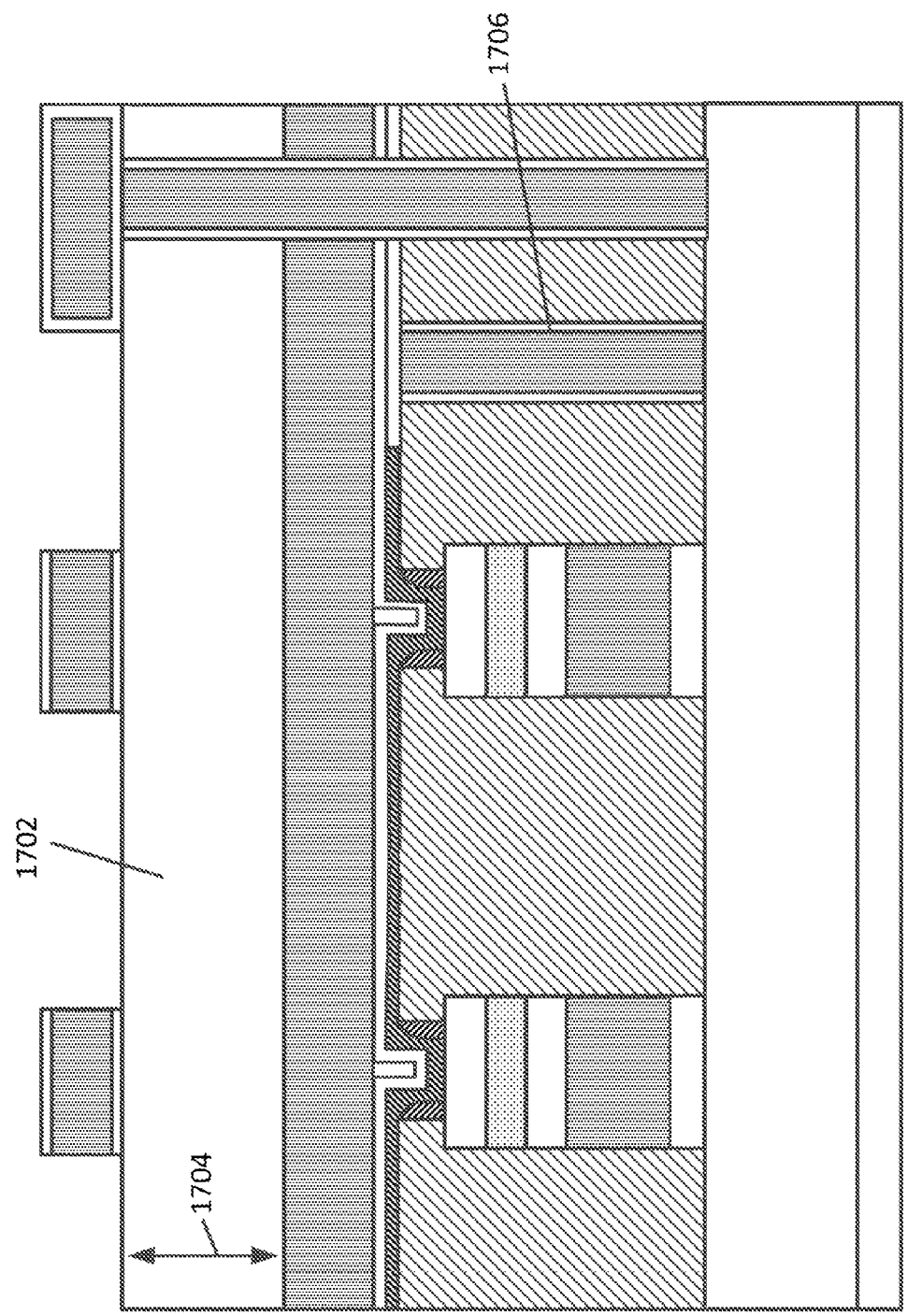
FIGS. 17-18 are simplified diagram illustrating a method of forming a vertically stacked memory device structure according to an embodiment of the present disclosure.

Referring again to FIG. 17. Depending on the embodiment, the method can form a plurality of via structures 1706 in a portion of the first dielectric material to connect the first array of memory cells with respective read, write, or erase circuitry provided by respective transistor devices on the semiconductor substrate. Via structure 1706 may connect the first top wiring structure or the first bottom wiring layer. In FIG. 17, the via structure connects to the first top wire layer. The via structure can be formed using a pattern and etch process to form an interconnect structure. In a specific embodiment, the method includes depositing an adhesion layer conformally formed overlying the via opening and an interconnect metal material overlying the adhesion layer to fill the plurality of via openings. The adhesion layer can be titanium, titanium nitride or tungsten nitride depending on the embodiment. The interconnect metal material can be tungsten, aluminum, copper or other suitable material. A metal planarizing process may be performed to remove the metal interconnect material from the dielectric surface in a specific embodiment. Alternatively, the via may be filled and metal deposited on top of the oxide 1704. This metal may be patterned and etched to form the bottom wire layer for the next layer of memory array. As shown, the via structure can be formed in an end region of each of the top wiring structure or the bottom wiring structure.

Though the present disclosure has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:
1. A semiconductor device having a memory device, comprising:
    a substrate;
    a first plurality of memory cells disposed upon the substrate comprising:
        a first plurality of top electrodes comprising a first metal layer, wherein the first plurality of top electrodes spatially extend in a first direction;
        a first plurality of bottom electrodes comprising a second metal layer, wherein the first plurality of bottom electrodes spatially extending in a second direction, wherein the first direction and the second direction are different;
        a first barrier material layer disposed in intersection regions between the first plurality of top electrodes and the first plurality of bottom electrodes, wherein the first barrier material layer contacts the first plurality of bottom electrodes within the intersection regions;
        a resistive switching material layer disposed in the intersection regions, wherein the resistive switching material layer contacts the first barrier material layer within a first contact region;
        an active metal layer disposed in the intersection regions, wherein the active metal layer contacts the resistive switching material layer within a second contact region; and
        a second barrier material layer disposed in the intersection regions, wherein the second barrier layer contacts the active metal layer and contacts the first plurality of top electrodes within the intersection regions;
    a dielectric material layer disposed overlying the first plurality of memory cells; and
    a second plurality of memory cells disposed upon the dielectric material layer;
    wherein a size of the first contact region and a size of the second contact region are different.
2. The semiconductor device of claim 1,
    wherein the first metal layer is selected from a group consisting of: copper and aluminum; and
    wherein the second metal layer is selected from a group consisting of: copper and aluminum.
3. The semiconductor device of claim 2, wherein the first barrier material layer comprises a material selected from a group consisting of: titanium, titanium nitride, tantalum, tantalum nitride, tungsten nitride, and a metal nitride.
4. The semiconductor device of claim 1, further comprising at least one CMOS device disposed within the substrate and below the first plurality of memory cells, wherein the CMOS device is coupled to at least one of the first plurality of memory cells.
5. The semiconductor device of claim 4, wherein the at least one CMOS device is selected from a group consisting of: a programming circuit, a read circuit, and an erase circuit.
6. The semiconductor device of claim 1,
    wherein particles of an active metal derived from the active metal layer at one of the intersection regions of a first memory cell from the first plurality of memory cells are disposed within a resistive switching material of the first memory cell and form a first filament.
7. The semiconductor device of claim 6, wherein the particles of the active metal are disposed within defect regions of the resistive switching material.
8. The semiconductor device of claim 6, wherein a resistance for the first memory cell is associated with a length of the first filament.

9. The semiconductor device of claim 1, wherein the second plurality of memory cells disposed upon the dielectric material layer comprises:
   a second plurality of top electrodes comprising a third metal layer, wherein the second plurality of top electrodes spatially extend in the first direction;
   a second plurality of bottom electrodes comprising a fourth metal layer, wherein the second plurality of bottom electrodes spatially extending in the second direction;
   a third barrier material layer disposed in second intersection regions between the second plurality of top electrodes and the second plurality of bottom electrodes, wherein the second barrier material layer contacts the second plurality of bottom electrodes within the intersection regions;
   a second resistive switching material layer disposed in the second intersection regions, wherein the second resistive switching material layer contacts the third barrier material layer within a third contact region;
   a second active metal layer disposed in the second intersection regions, wherein the second active metal layer contacts the second resistive switching material layer within a fourth contact region; and
   a fourth barrier material layer disposed in the second intersection regions, wherein the fourth barrier layer contacts second the active metal layer and contacts the second plurality of top electrodes within the intersection regions;
   a second dielectric material layer disposed overlying the second plurality of memory cells; and
   wherein a size of the third contact region and a size of the fourth contact region are different.

10. The semiconductor device of claim 9,
   wherein the third metal layer is selected from a group consisting of: copper and aluminum;
   wherein the fourth metal layer is selected from a group consisting of: copper and aluminum; and
   wherein the third barrier material layer comprises a material selected from a group consisting of: titanium, titanium nitride, tantalum, tantalum nitride, tungsten nitride, and a metal nitride.

11. A method for fabricating a semiconductor device, comprising:
   providing a substrate;
   forming a first plurality of bottom electrodes upon the substrate, wherein the first plurality of bottom electrodes comprising a first metal layer, wherein the first plurality of bottom electrodes spatially extend in a first direction;
   forming a first barrier material layer in contact with the first plurality of bottom electrodes within intersection regions;
   forming a resistive switching material layer in contact with the first barrier material layer within a first contact region within the intersection regions;
   forming an active metal layer in contact with the resistive switching material within a second contact region within the intersection regions;
   forming a second barrier material layer in contact with the active metal layer within the intersection regions;
   forming a first plurality of top electrodes in contact with the second barrier material layer, wherein the second plurality of top electrodes spatially extends in a second direction, wherein the first direction and the second direction are different, and wherein the first plurality of top electrodes and the first plurality of bottom electrodes spatially cross within the intersection regions and a first plurality of memory cells are formed at the intersection regions; and
   wherein a size of the first contact region and a size of the second contact region are different.

12. The method of claim 11,
   wherein the first metal layer is selected from a group consisting of: copper and aluminum; and
   wherein the second metal layer is selected from a group consisting of: copper and aluminum.

13. The method of claim 12, wherein the first barrier material layer comprises a material selected from a group consisting of: titanium, titanium nitride, tantalum, tantalum nitride, tungsten nitride, and a metal nitride.

14. The method of claim 11,
   wherein the providing the substrate comprises providing the substrate comprising a plurality of CMOS devices; and
   wherein the method further comprises coupling at least one CMOS device from the plurality of CMOS devices to at least one of the first plurality of memory cells.

15. The method of claim 14, wherein the plurality of CMOS devices are selected from a group consisting of: a portion of a programming circuit, a portion of a read circuit, and a portion of an erase circuit.

16. The method of claim 11, wherein particles of active metal layer of a first memory cell from the first plurality of memory cells are configured to be disposed with a resistive switching material of the first memory cell.

17. The method of claim 16, wherein the resistive switching material comprises a plurality of defect regions configured to store the particles of the active metal layer of the first memory cell.

18. The method of claim 16, wherein a resistance for the first memory cell is adjustable.

19. The method of claim 11, further comprising
   forming a dielectric material layer overlying the first plurality of memory cells;
   forming a second plurality of bottom electrodes upon the dielectric material layer, wherein the second plurality of top electrodes comprising a third metal layer, wherein the second plurality of top electrodes spatially extend in the first direction;
   forming a third barrier material layer in contact with the second plurality of bottom electrodes within second intersection regions;
   forming a second resistive switching material layer in contact with the third barrier material layer within a third contact region within the second intersection regions;
   forming a second active metal layer in contact with the second resistive switching material within a fourth contact region within the intersection regions;
   forming a fourth barrier material layer in contact with the second active metal layer within the second intersection regions;
   forming a second plurality of top electrodes in contact with the fourth barrier material layer, wherein the second plurality of top electrodes spatially extends in the second direction, and wherein the second plurality of top electrodes and the second plurality of bottom electrodes spatially cross within the intersection regions; and
   wherein a size of the first contact region and a size of the second contact region are different.

20. The method of claim 19,
wherein the third metal layer is selected from a group consisting of: copper and aluminum;
wherein the fourth metal layer is selected from a group consisting of: copper and aluminum; and
wherein the third barrier material layer comprises a material selected from a group consisting of: titanium, titanium nitride, tantalum, tantalum nitride, tungsten nitride, and a metal nitride.

21. A semiconductor device having a memory device, comprising:
a substrate;
a first memory cell disposed upon the substrate comprising:
a first top electrode comprising a first metal layer that spatially extends in a first direction;
a first bottom electrode comprising a second metal layer spatially extending in a second direction, wherein the first direction and the second direction are different;
a first barrier material layer disposed in intersection region between the first top electrode and the first bottom electrode, wherein the first barrier material layer contacts the first bottom electrode within the intersection region;
a resistive switching material layer disposed in the intersection region, wherein the resistive switching material layer contacts the first barrier material layer within a first contact region;
an active metal layer disposed in the intersection region, wherein the active metal layer contacts the resistive switching material layer within a second contact region; and
a second barrier material layer disposed in the intersection region, wherein the second barrier layer contacts the active metal layer and contacts the first top electrode within the intersection region;
a dielectric material layer disposed overlying the first memory cell; and
a second memory cell disposed upon the dielectric material layer;
wherein a size of the first contact region and a size of the second contact region are different.

22. The semiconductor device of claim 21
wherein the first metal layer comprises copper; and
wherein the second metal layer comprises: copper.

23. The semiconductor device of claim 22 wherein the first barrier material layer comprises a material selected from a group consisting of: titanium, titanium nitride, tantalum, tantalum nitride, tungsten nitride, and a metal nitride.

24. The semiconductor device of claim 21
wherein as deposited, the resistive switching material layer comprises an undoped silicon-containing material having a plurality of defect regions; and
wherein particles of an active metal derived from the active metal layer of the first memory cell are disposed with the defect regions of the resistive switching material and form a first filament.

25. The semiconductor device of claim 21 wherein the second memory cell disposed upon the dielectric material layer comprises:
a second top electrode comprising a third metal layer, wherein the second top electrode spatially extends in a third direction;
a second bottom electrode comprising a fourth metal layer, wherein the second bottom electrode spatially extends in a fourth direction;
a third barrier material layer disposed in an intersection region between the second top electrode and the second bottom electrode, wherein the second barrier material layer contacts the second bottom electrode within the intersection region;
a second resistive switching material layer disposed in the intersection region, wherein the second resistive switching material layer contacts the third barrier material layer within a third contact region;
a second active metal layer disposed in the intersection region, wherein the second active metal layer contacts the second resistive switching material layer within a fourth contact region; and
a fourth barrier material layer disposed in the intersection region, wherein the fourth barrier layer contacts the second active metal layer and contacts the second top electrode within the intersection region;
a second dielectric material layer disposed overlying the second memory cell;
wherein a size of the third contact region and a size of the fourth contact region are different;
wherein the third direction and the fourth direction are different;
wherein the third metal layer comprises copper;
wherein the fourth metal layer comprises copper; and
wherein the third barrier material layer comprises a material selected from a group consisting of: titanium, titanium nitride, tantalum, tantalum nitride, tungsten nitride, and a metal nitride.

* * * * *